United States Patent
Arrigo (10) Patent No.: US 8,159,291 B2
(45) Date of Patent: *Apr. 17, 2012

(54) AM (AMPLITUDE MODULATION) DEMODULATION SYSTEM FOR RFID READER DEVICE

(75) Inventor: Aydin Arrigo, Porza (CH)

(73) Assignee: Datamars S.A. (CH)

( * ) Notice: Subject to any disclaimer, the term of this patent is extended or adjusted under 35 U.S.C. 154(b) by 30 days.

This patent is subject to a terminal disclaimer.

(21) Appl. No.: 12/848,661

(22) Filed: Aug. 2, 2010

(65) Prior Publication Data

US 2010/0328041 A1    Dec. 30, 2010

Related U.S. Application Data

(63) Continuation-in-part of application No. 12/274,210, filed on Nov. 19, 2008, now Pat. No. 7,791,409.

(30) Foreign Application Priority Data

Dec. 21, 2007    (EP) .................................... 07024935

(51) Int. Cl.
*H03D 1/00* (2006.01)
*H03D 1/08* (2006.01)
*H03D 1/10* (2006.01)

(52) U.S. Cl. .......................... 329/363; 329/365; 329/366

(58) Field of Classification Search .................. 329/347, 329/348, 363–366, 370

See application file for complete search history.

(56) References Cited

U.S. PATENT DOCUMENTS

| 3,437,941 A | 4/1969 | Leary |
| 3,493,871 A | 2/1970 | Mason et al. |
| 7,791,409 B2 * | 9/2010 | Arrigo .......................... 329/363 |
| 2006/0103457 A1 | 5/2006 | Kumar et al. |

FOREIGN PATENT DOCUMENTS

| DE | 1908382 A1 | 9/1969 |
| GB | 2078034 A | 12/1981 |

* cited by examiner

*Primary Examiner* — David Mis
(74) *Attorney, Agent, or Firm* — Akerman Senterfitt (57) ABSTRACT

An RFID reader device (31), of the type comprising a demodulator (6) for receiving from a RFID tag (11) an AM (Amplitude Modulation) wave (20) having a predetermined frequency (f) and for retrieving, from the AM wave (20), a demodulated output (6a) associated to predetermined positive or negative Amplitudes of said AM wave (20), said demodulated output having a portion with a frequency F. The AM demodulation system comprises at least a second demodulator (26) for receiving the AM wave (20) and retrieving a second demodulated output (26a) associated to Amplitudes opposite to the predetermined positive or negative Amplitudes, said second demodulated output having a portion with said frequency F; the RFID reader includes a block (27) having, in input, the demodulated output (6a) and the second demodulated output (26a) and returning, in output, an enforced demodulated output (30) with a portion with frequency (f1) doubled with respect to said frequency (F).

8 Claims, 5 Drawing Sheets

AM (AMPLITUDE MODULATION) DEMODULATION SYSTEM FOR RFID READER DEVICE

CROSS-REFERENCE TO RELATED APPLICATIONS

This application is a continuation-in-part of U.S. patent application Ser. No. 12/274,210, filed Nov. 19, 2008, the entirety of which is incorporated herein by reference.

FIELD OF APPLICATION

The present invention relates to an AM (Amplitude Modulation) demodulation system for an RFID (Radio Frequency Identification) reader device of the type comprising a demodulator for receiving, from an RFID tag, an AM wave having a predetermined frequency and for retrieving, from the AM wave, a demodulated output associated to predetermined positive or negative Amplitudes of the AM wave.

The present application also relates to a method for AM demodulation for an RFID reader device, comprising the steps of:

receiving from an RFID tag an AM wave having a predetermined frequency;

retrieving, from the AM wave, a demodulated output associated to predetermined positive or negative Amplitudes of the AM wave.

PRIOR ART

As it is well known, an AM (Amplitude Modulation) demodulation system for an RFID (Radio Frequency Identification) reader device provides to demodulate an RF (Radio Frequency) signal modulated by an RFID tag, in order to retrieve a demodulated output.

Figure 1:
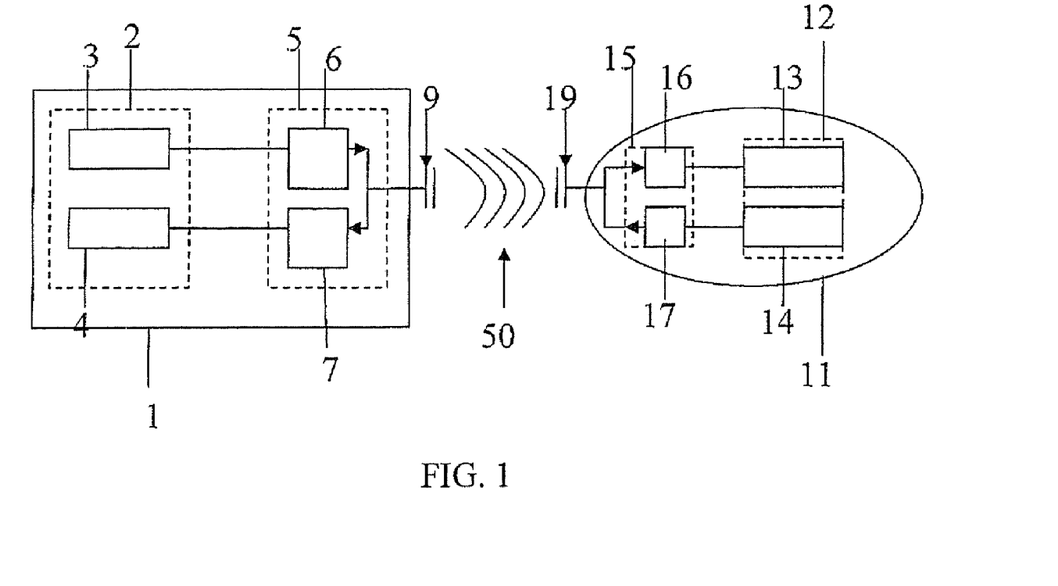
FIG. 1 schematically shows an RFID reader device including an AM demodulation system for demodulating AM waves modulated by an RFID tag, according to the prior art.

With reference to FIG. 1 it is schematically shown and globally indicated with numeral reference 1 a prior solution concerning an RFID reader device 1 including an antenna 9, operating at low frequency, i.e. 134.2 Khz, and an internal circuitry comprising a non-volatile memory unit for storing data 3, 4. The internal circuitry also comprises means 5 for receiving the RF signal modulated by an RFID tag 11.

More particularly, the RFID reader device 1 emits an RF magnetic field 50. When the RFID tag 11 is absorbed in the magnetic field 50, it activates and modulates the magnetic field 50 into the modulated RF signal, for transmitting an ID (Identification) number or more complex data stored in a non-volatile memory unit 13, 14 of the tag 11.

This kind of RFID tag 11 are also known as passive RFID tags 11 because they have no internal power supply but they use the small electrical current induced in an antenna 19 by the magnetic field 50, in order to power the internal circuitry and modulate a carrier wave 50 into a modulated RF signal for the RFID reader device 1.

The RFID tag 11 comprises its own memory unit 12, for storing data 13, 14, and its own magnetic loop antenna 19, operating at the same frequency of 134.2 Khz, as well as means 15 for modulating the carrier wave into the modulated RF signal.

In FIG. 1, just for example purpose, it is schematically represented the generation of the magnetic field 50 from the RFIB reader device 1 and the modulation of the carrier wave 50 into the modulated RF signal for the transmission of data 13 from the RFID tag 11 to the RFID reader device 1.

Figure 2A:
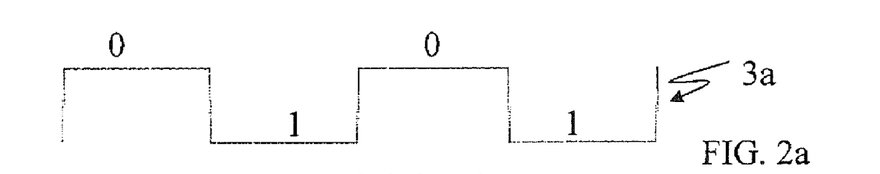
FIG. 2a schematically represents a digital signal representing a sequence of digital data modulated through the AM waves.

The digital data 13 is stored in the memory unit 12 and is modulated for transmission by a modulator 16 included in said means 15 of the RFID tag 11. More particularly, the modulator 16 transmits the digital data 13, for example the sequence 0101, that is a square wave 3a as schematically represented in FIG. 2a, by modulating a carrier wave 50, having a predetermined frequency, as schematically represented in FIG. 2c.

Figure 2B:
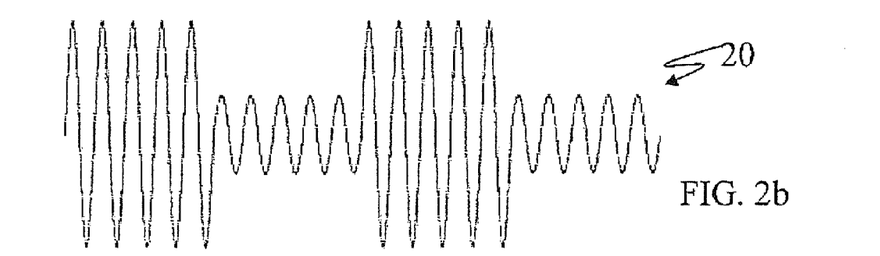
FIG. 2b schematically represents the AM waves modulated by the RFID tag.
Figure 2C:
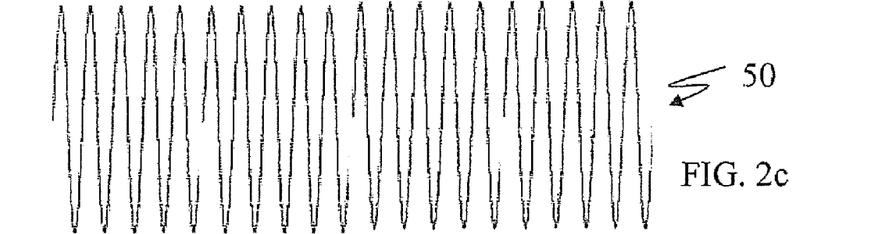
FIG. 2c schematically represents a carrier wave.

The modulated RF signal 20, obtained by modulating the carrier wave 50 with the square wave 3a, is schematically represented in FIG. 2b. Such modulated signal is for example an Amplitude Modulation wave 20, hereinafter also indicated as AM wave 20.

More particularly, the AM wave 20 is transmitted through the antenna 19 of the RFID tag 11 to the magnetic loop antenna 9 of the RFID reader device 1, wherein it is demodulated by a demodulator 6 included in said means 5 of the RFID reader device 1.

Figure 3:
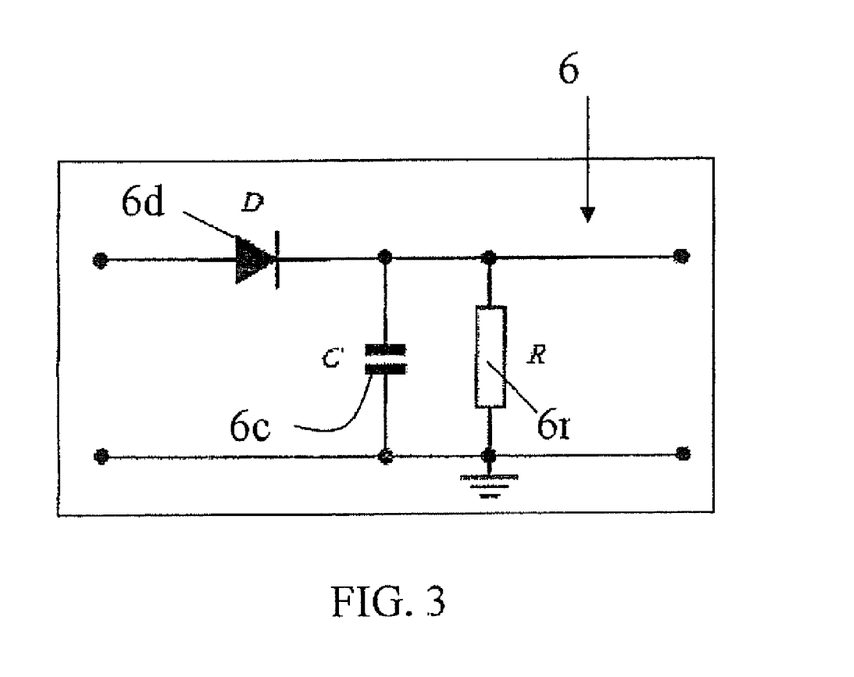
FIG. 3 schematically shows a demodulator of the RFID reader device of FIG. 1, according to the prior art.
Figure 4:
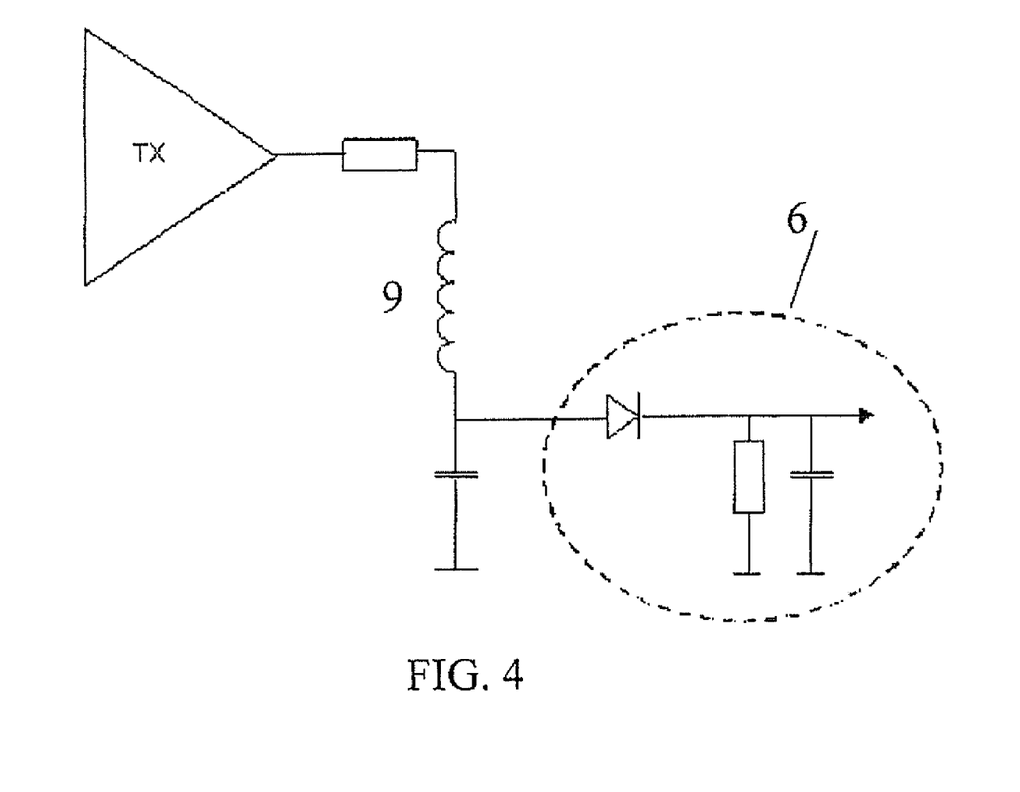
FIG. 4 schematically shows the demodulator of FIG. 3 together with a magnetic loop antenna and other circuitry of the RFID reader device, according to the prior art.

In order to keep a low cost internal circuitry of the RFID reader device 1 and to require little energy, the demodulator 6 includes few and simple electronic components or elements. More particularly, a simple and cheap demodulator 6 includes a diode 6d, a capacitor 6c and a resistor 6r, as schematically represented in FIG. 3. The demodulator 6 is further represented in FIG. 4, together with the antenna 9 and other known electronic components of the RFID reader device 1.

The demodulator 6 is essentially a half wave rectifier which charges the capacitor 6c to a peak voltage of the AM wave 20. So, when the amplitude of the AM wave 20 increases, the voltage of the capacitor 6c is increased via the diode 6d while, when the amplitude of the AM wave 20 decreases, the voltage of the capacitor 6c is reduced, being discharged by the resistor 6r.

In fact, the diode 6d allows current through when the AM wave 20 is positive with respect to the voltage of the capacitor 6c, until the capacitor 6c voltage reaches a peak level, and blocks any current from flowing back through the diode 6d when the voltage of the AM wave 20 is negative with respect to the voltage of the capacitor 6c.

Figure 5A:
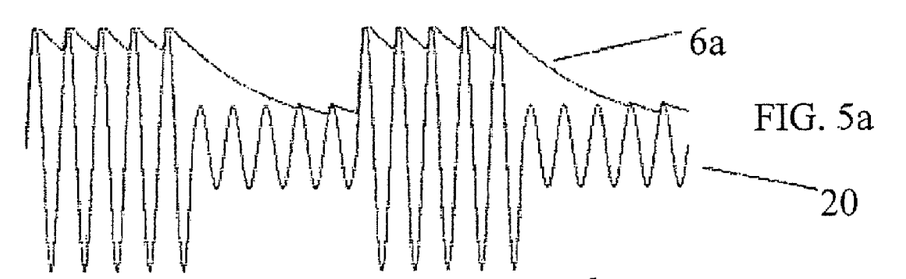
FIG. 5a schematically shows the AM wave modulating the digital signal of FIG. 2a, and, in overlapping, the corresponding demodulated output produced by the demodulator of FIG. 3.
Figure 5B:
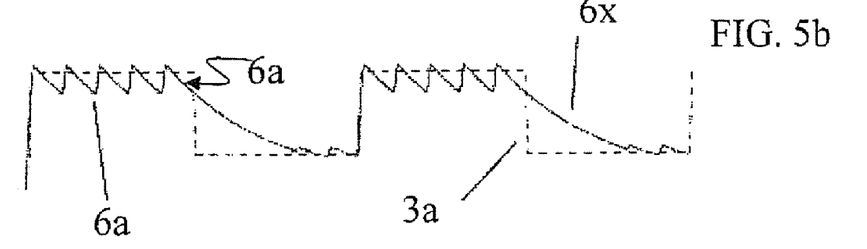

In FIG. 5b is schematically represented with numeral reference 6a the result of such a demodulation, also indicated as demodulated output 6a, executed by the demodulator 6 on the AM wave 20, in other words the extraction of the carrier wave 50 from the AM wave 20, in order to retrieve the output 6a representing the original square wave 3a. In dash lines, the square wave 3a corresponding to the demodulated output 6a, is represented and overlapped to it.

According to the demodulator 6, the AM wave 20 is demodulated considering only the positive portion of the AM wave 20, as it is apparent from FIG. 5a where the demodulated output 6a and the AM wave 20 are represented in overlapping.

Even if the AM demodulation system based on the demodulator like the one referred by numeral 6 are very cheap and simple, they are limited for the fact that they do not allow an effective demodulation of the AM wave 20, especially if it is disturbed.

Moreover, with reference to the simple and cheap demodulator 6 described above, the diode 6d is non-linear and the current passing through such a diode may vary with the applied voltage. As a result, the demodulated output 6a is slightly distorted in a manner which depends upon the electric characteristics of the diode 6d.

Furthermore, the capacitor 6c is discharged for a small amount in between successive peaks of the AM wave 20 so that it is not really easy to reconstruct the original square wave 3a between the successive peaks, as indicated with 6x in FIG. 5b.

More particularly, this problem is further limiting if the frequency of the square wave 3a to be decoded is not much lower than the frequency of the carrier wave 50.

RFID tags compliant with low frequency standard work at a predetermined low frequency. In this case, if the frequency of the square wave is close to the frequency of the AM wave 20, the demodulated output 6a between successive peaks may be so high that the digital signal corresponding to the original square wave 3a is very difficult to be filtered (or even impossible to be filtered).

At the same time, the frequency of the carrier wave cannot be increased to reduce the problem explained above, since the RFID tags must be compliant with said low frequency standard.

The problem at the base of the present invention is that of providing an AM demodulation system for an RFID reader device still having a simple and cheap configuration, for example of the type including a cheap demodulator with a diode, a capacitor and a resistor, but capable to retrieve a demodulated output from which it is easier to filter the square wave corresponding to digital data modulated by an RFID tag through an AM wave 20, and extracting the maximum energy from the information modulated on the carrier wave by the tag, overcoming the limitation that currently affects the AM demodulation system for RFID reader device.

SUMMARY OF THE INVENTION

The solution idea of the present invention is to provide the RFID reader device with at least a couple of cheap and simple demodulators for demodulating the AM wave in a couple of respective first and second outputs, substantially corresponding to opposite Amplitude side of the AM wave, and an enforcing block for subtracting the first and second outputs and obtaining a resulting output, having a frequency grater with respect to the first and second outputs, from which frequency it is easier to filter the original digital signal.

According to such idea of solution, the technical problem cited above is solved by an AM (Amplitude Modulation) demodulation system for an RFID (Radio Frequency Identification System) reader device, of the type comprising a demodulator for receiving from an RFID tag an AM (Amplitude Modulation) wave having a predetermined frequency and for retrieving, from said AM wave, a demodulated output associated to predetermined positive or negative Amplitudes of said AM wave, characterized by comprising at least a second demodulator for receiving said AM wave and retrieving a second demodulated output associated to Amplitudes opposite to said predetermined positive or negative Amplitudes and a block receiving as inputs said first demodulated output and said second demodulated output and providing as output an enforced demodulated signal having a frequency greater than said predetermined frequency.

According to the idea of solution described above, the technical problem is also solved by a method for AM (Amplitude Modulation) demodulation for an RFID reader device, comprising the steps of:

receiving from an RFID tag an AM (Amplitude Modulation) wave having a predetermined frequency;

retrieving, from said AM wave, a demodulated output associated to predetermined positive or negative Amplitudes of said AM wave, retrieving a second demodulated output associated to Amplitudes opposite to said predetermined positive or negative Amplitudes;

computing, from said demodulated output and said second demodulated output, an enforced demodulated output with a frequency greater than said predetermined frequency.

Advantageously, the AM demodulation system according to the present invention is based on a simple and cheap configuration of electronic components, for example including only a couple of demodulators respectively comprising a diode, a capacitor and a resistor.

Advantageously, the AM demodulation system retrieves an enforced demodulated output from which it is easier to filter the digital signal corresponding to data modulated by a RFID tag through an AM wave 20.

Advantageously, the AM demodulation system uses both Amplitudes sides of the AM Wave, extracting each side with a corresponding demodulator and subtracting one amplitude side to the other in order to return the enforced demodulated output with a residual frequency of two times the frequency of the carrier wave.

Advantageously, the enforced demodulated output is easier to be filtered because the residual carrier frequency is two times greater than the current carrier frequency transmitted by the RFID reader device. Moreover, subtracting the two demodulated output, any noise may be cancelled.

Other features and advantages of the AM demodulation system will be apparent from the following description of an embodiment thereof, given by way of non-limitative example with reference to the accompanying drawings.

SHORT DESCRIPTION OF THE DRAWINGS

FIG. 5b schematically shows the demodulated output of FIG. 5a overlapped to the digital signal of FIG. 2a;

FIG. 6c schematically shows the demodulated output of FIG. 6b overlapped to the digital signal of FIG. 6a;

DETAILED DESCRIPTION

With reference to the annexed drawings and with numeral reference 36 is schematically represented an AM demodulation system for an RFID (Radio Frequency Identification) reader device 31 providing that a modulated RF (Radio Frequency) signal 20, transmitted by an RFID tag, is demodulated into a demodulated output 30.

More particularly, the RFID reader device 31 comprises a magnetic loop antenna 9 to emit a magnetic field. When an RFID tag is absorbed in the magnetic field produced by the RFID reader device 31, it activates and modulates an RF modulated signal 20, for transmitting an ID number or more complex data stored in a non-volatile memory unit of the tag. The magnetic loop antenna 9 operates at low frequency, i.e. 134.2 KHz.

The RFID reader device 31 comprises an internal circuitry, including the AM demodulation system 36. The RFID tag is not provided with an internal power supply but uses the minute electrical current, induced in the antenna of the tag by the magnetic field generated by the RFID reader device 36, in order to power the internal circuitry and to modulate a carrier wave into a modulated RF signal for the RFID reader device 31.

Figure 6A:
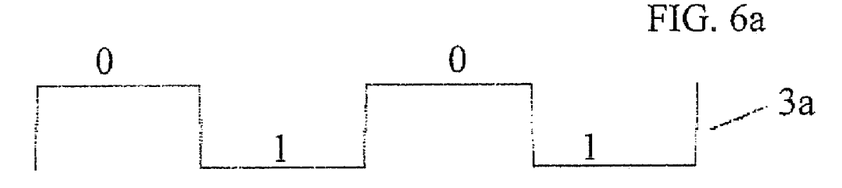
FIG. 6a schematically represents a digital signal intended to be demodulated by the demodulator according to the present invention.
Figure 6B:
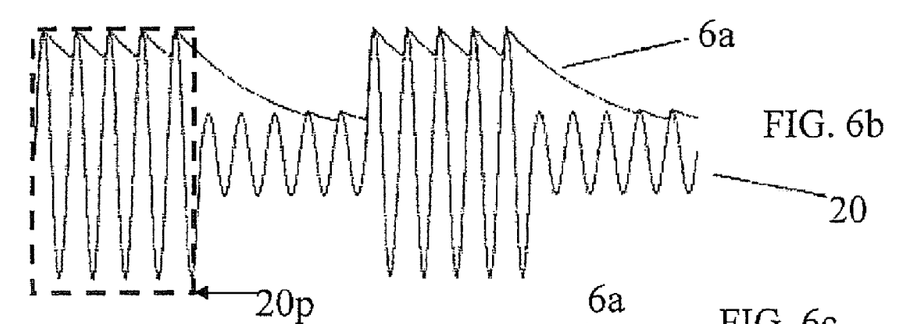
FIG. 6b schematically represents an AM wave modulating the digital signal of FIG. 6a and, in overlapping, the corresponding demodulated output produced by a first demodulator, according to the present invention.

Digital data 13, for example the sequence 0101, that is a digital signal 3a, as schematically represented in FIG. 6a, is transmitted by the RFID tag as a modulated RF signal 20, as represented in FIG. 6b.

The modulated signal 20 is an Amplitude Modulation wave 20, hereinafter also indicated as AM wave 20, and is transmitted to the magnetic loop antenna 9 of the RFID reader device 31, wherein it is demodulated by the AM demodulations system 36.

Figure 9:
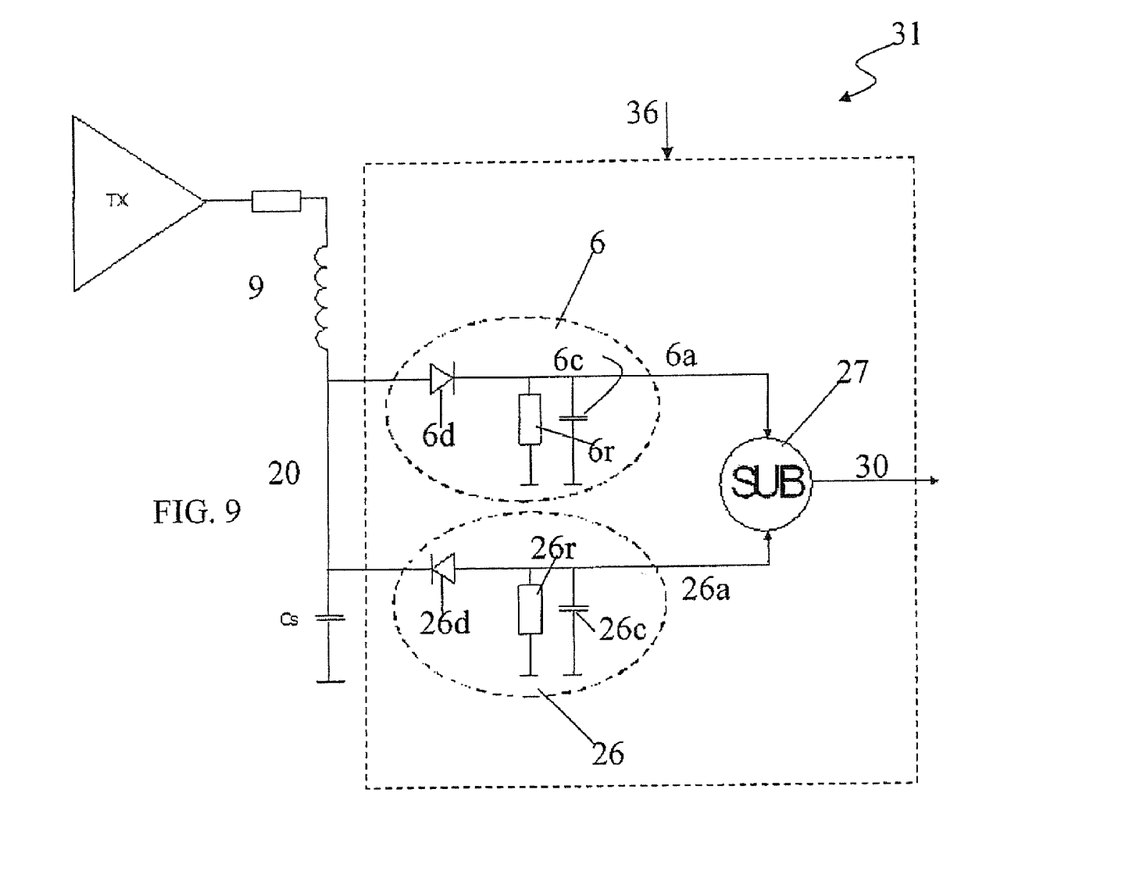
FIG. 9 schematically represents a demodulator for an RFID reader device, according to the present invention.

Without limiting the scope of the present invention, the AM demodulations system 36 comprises a demodulator 6 including a diode 6d, a capacitor 6c and a resistor 6r, as schematically represented in FIG. 9. However, a demodulator 6, based on different electronic circuitry, may be used, preferably based on an easy and cheap configuration.

The demodulator 6 is essentially a half wave rectifier which charges the capacitor 16c to a peak voltage of the AM wave 20. When the amplitude of the AM wave 20 increases, the voltage of the capacitor 6c is increased via the diode 6d while, when the amplitude of the AM wave 20 decreases, the voltage of the capacitor 6c is reduced, being discharged by the resistor 6r.

The diode 6d allows current through when the AM wave 20 is positive with respect to the voltage of the capacitor 6c, until the capacitor 6c voltage reaches a peak level, and blocks any current from flowing back through the diode 6d when the voltage of the AM wave 20 is negative with respect to the voltage of the capacitor 6c.

Figure 6C:
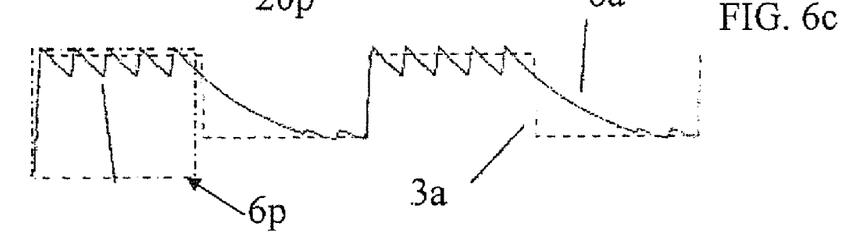

In FIG. 6c is schematically represented with numeral reference 6a the result of the demodulation, also indicated as demodulated output 6a, executed by the first demodulator 6 on the AM wave 20 and, in dash lines, the digital signal 3a corresponding to such demodulated output 6a, is represented and overlapped to it. The demodulated output 6a includes a portion 6p with a frequency F, for example between 100 and 150 KHz.

Figure 7:
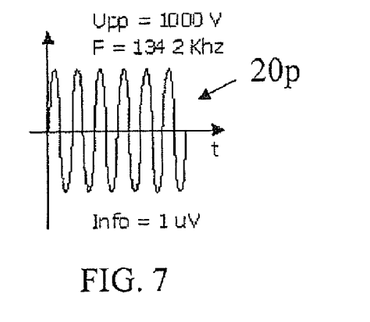
FIG. 7 schematically represents a portion of the AM wave of FIG. 6b.
Figure 8:
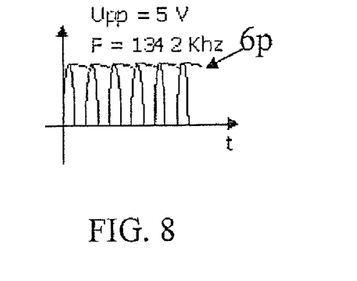
FIG. 8 schematically represents a portion of the demodulated signal, corresponding to the portion of the AM wave of FIG. 7.

More particularly, in FIG. 6b it is indicated and surrounded by an embossed dashed frame, a portion 20p of the incoming AM wave 20 while a corresponding portion 6p of the demodulated output 6a is indicated and surrounded by a non-embossed dashed frame in FIG. 6c. The portions 20p and 6p are reported respectively in FIGS. 7 and 8, for convenience of explanation only.

According to the present invention, the AM demodulation system comprises a second demodulator 26 for executing an additional demodulation of the AM wave 20, as will be apparent from the following description.

Without limiting the scope of the present invention, the second demodulator 26 includes a capacitor 26c and a resistor 26r and a diode 26d with inverted polarity with respect to the diode of the first modulator 12, as schematically represented in FIG. 9.

However, a demodulator 26 based on different electronic circuitry may be used, preferably maintaining an easy and cheap configuration.

Also the demodulator 26 is a half wave rectifier which charges the capacitor 26c to a peak voltage of the AM wave 20.

Advantageously, when the amplitude of the AM wave 20 increases, the voltage of the capacitor 6c is increased via the diode 6d while the voltage of the capacitor 26c is reduced, being discharged by the resistor 26r.

On the contrary, when the amplitude of the AM wave 20 decreases, the voltage of the capacitor 6c is reduced, being discharged by the resistor 6r, and the-voltage of the capacitor 26c increases, via the diode 26d.

More particularly, the diode 26d allows current through when the AM wave 20 is negative with respect to the voltage of the capacitor 26c, until the capacitor 26c voltage reaches a peak level, and blocks any current from flowing back through the diode 26d when the voltage of the AM wave 20 is positive with respect to the voltage of the capacitor 6c.

Figure 10:
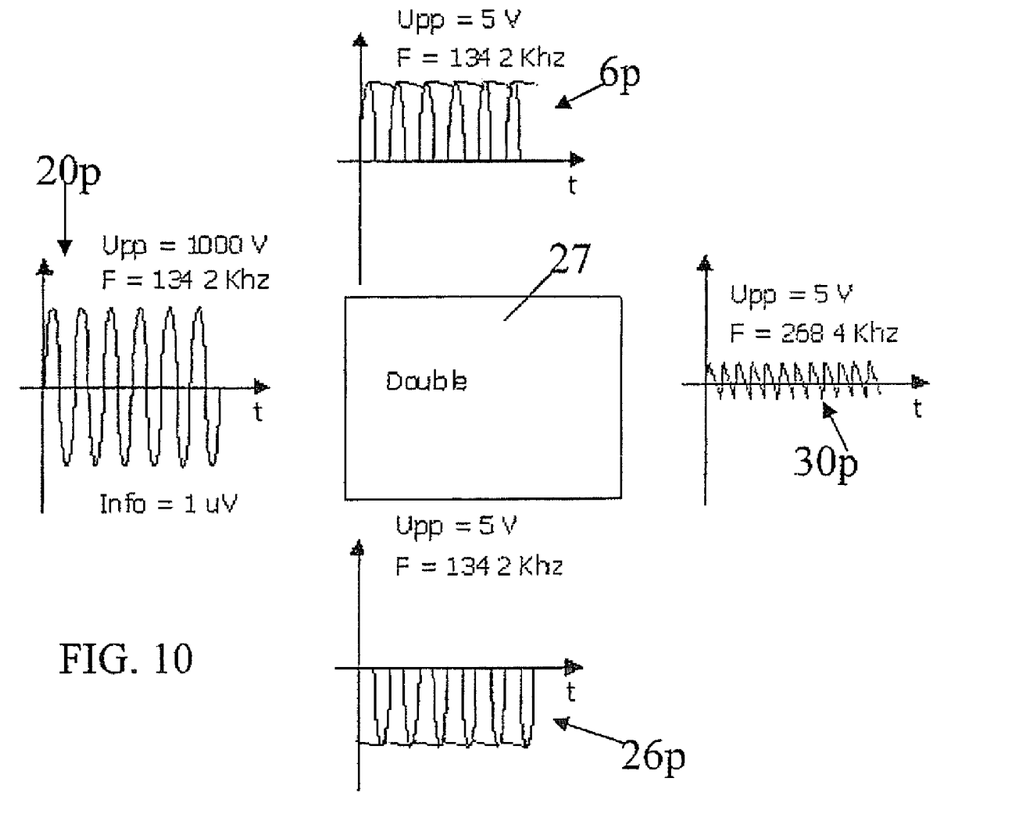
FIG. 10 schematically represents the steps of executions of an AM demodulation system according to the present invention.

In other words, while the demodulator 6 demodulates the AM wave 20 considering the positive side of such AM wave 20, as it is apparent from FIG. 10 representing the portion 6p of the demodulated output 6a and the portion 20p of the AM wave 20, the demodulator 26 demodulates the AM wave 20 considering its negative part, as it schematically represented with reference to the portion 26p of the demodulated output 26a. Also the portion 26p has the frequency F of the portion 6p, for example between 150 and 200 KHz.

As it is shown in the drawings the capacitor 6c and the resistor 6r of the first demodulator 6 are connected in parallel. Also the capacitor 26c and the resistor 26r of the second demodulator 26 are connected in parallel.

More particularly, the AM demodulation system 36 according to the invention comprises an additional block 27 receiving as inputs the demodulated outputs 6a, 26a, respectively, issued by the first 6 and the second 26 demodulators and producing as output an enforced demodulated signal 30 having a portion with a frequency f1 double with respect to the frequency F of the portions 6p and 26p.

With reference to FIG. 10, it is schematically represented a portion 30p of the enforced demodulated output 30 resulting by the elaboration of the input signals. This elaboration is performed inside the block 27 of the portion 6p of the demodulated output 6a and the portion 26p of the demodulated output 26a. In the example given in FIG. 10, the portion 30p of the enforced demodulated output has a frequency f1 of 268.4 Khz that is the double with respect to the frequency f of the portions 6p, 26p of the outputs 6a, 26a.

The portions 6p and 26p are not cancelled but subtracted in the sub-tractor block 27 to obtain a portion 30p in the enforced demodulated output, having a frequency doubled with respect to the frequency of the portions 6p and 26p.

According to the present invention, an RFID reader device is provided for detecting, from an AM wave modulated by an RFID tag, an enforced demodulated output which is obtained from two opposite demodulated output retrieved from said AM modulated wave, each demodulated output having a portion with a frequency F and the enforced demodulated output having a portion with doubled frequency 2*F.

Advantageously, the portion of the enforced demodulated output with doubled frequency 2*F, in output from the block 27 of the RFID reader, may be filtered easily with respect to the portion of the demodulated output with frequency F; thus, the useful digital signal may be extracted easily and more precisely from the enforced demodulated output. From a hardware viewpoint, this means that low order and simple filter, introducing low distortion, may be used in the RFID reader.

Thus, according to the present invention, the RFID reader device 31 comprises a demodulator 6 for receiving from the RFID tag 11 an AM wave 20 having a predetermined frequency f and for retrieving, from the AM wave 20, a demodulated output 6a associated to predetermined positive or negative Amplitudes of the AM wave 20, wherein the demodulated output 6a includes a portion 6p with a frequency F.

Additionally, the RFID reader comprises at least a second demodulator 26 for receiving the AM wave 20 and retrieving a second demodulated output 26a associated to Amplitudes opposite to said predetermined positive or negative Amplitudes, said second demodulated output including a portion 26p with said frequency F.

A block 27 of the RFID reader receives as inputs the first demodulated output 6a and the second demodulated output 26a and provides as output the enforced demodulated signal 30 having portions 30p with frequency 2*F double with respect to the frequency F.

Advantageously, according to the present invention, the demodulated signal is enforced because the energy is doubled. Moreover, also the frequency F is doubled so that less order filters are required to extract the useful digital signal in the RFID reader; the filter stage may be simpler and cheaper as well as it introduces less distortion.

According to a preferred embodiment of the invention, the frequency F is in the range of 100-150 kHz and it is doubled into a frequency 2*F of the enforced demodulated output in the range of 200-300 kHz.

This is very advantageous in RFID application wherein the carrier frequency is relatively close to the modulation signal and thus rather difficult to eliminate.

It should be noted, without limiting the scope of the present invention, that the block 27 is a subtractor block 27 (also indicated with SUB) providing for subtracting from the positive demodulated output Ga the negative demodulated output 26a. This is done in order to obtain the enforced demodulated output 30 with doubled energy.

In other words, the demodulated output 6a is associated to the positive Amplitudes of the AM wave 20, the second demodulated output 26a is associated to its negative Amplitudes and the subtraction block 27 subtracts the second demodulated output 26a from the demodulated output 6a.

With reference to the above indicated drawings, the present invention also relates to a method for AM (Amplitude Modulation) demodulation for RFID reader device 31.

More particularly, the method comprises the followings steps:

receiving from a RFID tag 11 an AM (Amplitude Modulation) wave 20 having a predetermined frequency f;

retrieving, from the AM wave 20, a demodulated output 6a associated to predetermined positive or negative Amplitudes of the AM wave and including a portion 6p with a frequency F.

According to the invention, the method provides to retrieve a second demodulated output 26a associated to Amplitudes opposite to the predetermined positive or negative Amplitudes with a portion 26p of frequency F. For example, the first demodulator 6 provides a demodulated output 6a associated to positive Amplitudes and the second demodulator 26 provides a second demodulated output 26a associated to negative Amplitudes.

The method also provides to compute, from the demodulated output 6a and the second demodulated output 26a, an enforced demodulated output 30 having a portion 30p p with a frequency f1 doubled with respect to the frequency F. In the example given above, the demodulated output 26a associated to negative Amplitudes is subtracted from the demodulated output 6a associated to negative Amplitude, resulting in an enforced demodulated output 30 having a portion 30p with a frequency f1 double with respect to the frequency F of both the first and the second output.

Advantageously, using both sides of the AM Wave by introducing at least an additional demodulator 26 which extracts the negative side of the AM Wave, the negative side may be subtracted from the positive side provided by the first demodulator 16, resulting in an enforced demodulated output with a residual frequency of two times the frequency of the carrier wave.

Advantageously, the enforced demodulated output is easier to filter because the residual carrier frequency wave is two times more faraway from the useful information represented by the digital signal. Advantageously, subtracting the two demodulated output 6a and 26a, any noise may be cancelled.

Advantageously, the AM demodulation system according to the present invention is based on a simple and cheap configuration of electronic components, for example including only a couple of demodulators respectively comprising a diode, a capacitor and a resistor.

Advantageously, the AM demodulation system retrieves an enforced demodulated output from which it is easy to filter the digital signal corresponding to digital data modulated by a RFID tag through an AM wave 20.

Advantageously, the AM demodulation system avoids modification to the AM wave 20 modulated by the RFID tag and allows working at a predetermined low frequency of the carrier wave.

Advantageously, the AM demodulation system according to the present invention is based on a simple and cheap configuration of electronic components, for example including only a couple of demodulators respectively comprising a diode, a capacitor and a resistor.

Advantageously, the AM demodulation system retrieves an enforced demodulated output from which it is easy to filter the digital signal corresponding to digital data emitted by a RFID tag through an AM wave 20.

The invention claimed is:

1. An RFID (Radio Frequency Identification) reader device comprising:

a demodulator for receiving from an RFID tag an AM (Amplitude Modulation) wave having a predetermined frequency (f) and for retrieving, from said AM wave, a demodulated output associated to predetermined positive or negative Amplitudes of said AM wave, said demodulated output including a portion with a frequency F;

at least a second demodulator for receiving said AM wave and retrieving a second demodulated output associated to Amplitudes opposite to said predetermined positive or negative Amplitudes, and including a portion with said frequency F; and a circuit block receiving as inputs said first demodulated output and said second demodulated output and providing as output an enforced demodulated signal having a portion with a frequency (f1) double with respect to said frequency F.

2. The RFID reader according to claim 1, wherein said demodulated output is associated to the positive Amplitudes, said second demodulated output is associated to negative Amplitudes and said block is a subtraction block for subtracting the second demodulated output from the demodulated output.

3. The RFID reader according to claim 2, wherein said demodulator and said second demodulator comprise respectively a first and a second diode, a first and a second capacitor and a first and a second resistor.

4. The RFID reader according to claim 3, wherein said first capacitor and said first resistor are connected in parallel.

5. The RFID reader according to claim 4, wherein said second capacitor and said second resistor are connected in parallel.

6. The RFID reader according to claim 5, wherein said first and a second diode have inverted polarities.

7. A method for AM (Amplitude Modulation) demodulation for an RFID (Radio Frequency Identification) reader device, comprising the steps of:

receiving from a RFID tag an AM (Amplitude Modulation) wave having a predetermined frequency (f);

retrieving, from said AM wave, a demodulated output associated to predetermined positive or negative Amplitudes of said AM wave, said demodulated output including a portion with a frequency F;

further retrieving a second demodulated output associated to Amplitudes opposite to said predetermined positive or negative Amplitudes, said second demodulated output including a portion with said frequency F; and computing, from said demodulated output and said second demodulated output, an enforced demodulated output including a portion with a frequency (f1) double with respect to said predetermined frequency F.

8. The method for AM demodulation according to claim 7, wherein said step of retrieving retrieves the demodulated output, associating it to the positive Amplitudes of said AM wave, and said step of further retrieving retrieves the second demodulated output, associating it to negative Amplitudes, said step of computing including subtracting the second demodulated output from the demodulated output.

* * * * *